(12) United States Patent
Nakata

(10) Patent No.: US 7,779,377 B2
(45) Date of Patent: Aug. 17, 2010

(54) METHOD AND APPARATUS FOR AIDING VERIFICATION OF CIRCUIT, AND COMPUTER PRODUCT

(75) Inventor: Tsuneo Nakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 558 days.

(21) Appl. No.: 11/698,858

(22) Filed: Jan. 29, 2007

(65) Prior Publication Data

US 2008/0126768 A1 May 29, 2008

(30) Foreign Application Priority Data

Sep. 26, 2006  (JP)  ............... 2006-260339

(51) Int. Cl.
*G06F 17/50* (2006.01)
(52) U.S. Cl. .......................................... 716/5
(58) Field of Classification Search ...................... 716/5
See application file for complete search history.

(56) References Cited

U.S. PATENT DOCUMENTS

| | | | | |
|---|---|---|---|---|
| 5,495,422 A * | 2/1996 | Olson | ........................... | 716/21 |
| 5,537,580 A * | 7/1996 | Giomi et al. | .................. | 716/19 |
| 6,523,151 B2 * | 2/2003 | Hekmatpour | .................. | 716/4 |
| 7,103,803 B2 * | 9/2006 | Elez | ............................. | 714/33 |
| 7,313,773 B1 * | 12/2007 | Braun et al. | ................... | 716/5 |
| 7,506,279 B2 * | 3/2009 | Yamada | .......................... | 716/4 |
| 2002/0002698 A1 * | 1/2002 | Hekmatpour | .................. | 716/4 |
| 2009/0037697 A1 * | 2/2009 | Ramani et al. | ............... | 712/214 |
| 2009/0172630 A1 * | 7/2009 | Wang et al. | .................... | 716/18 |

FOREIGN PATENT DOCUMENTS

| | | |
|---|---|---|
| JP | 5-151297 | 6/1993 |
| JP | 2002-157145 | 5/2002 |
| JP | 2004-54549 | 2/2004 |
| JP | 2006-190209 | 7/2006 |

OTHER PUBLICATIONS

Farzan Faliah et al., "Event-driven observability enhanced coverage analysis of C programs for functional validation". *The ACM Digital Library*, [Online], Web URL: <http://portal.acm.org/affiliated/citation.cfm?id=1119797&dl=acm&coll=GUIDE&CFID=15151515&CFTOKEN=6184618>, Searched on Nov. 30, 2006. Abstract Only.
Richard Goering, "InnoLogic launches symbolic tools", *EETIMES Online*, [Online], Web URL: <http://www.eetimes.com/new/latest/showArticle.jhtml?articleID=18303007>, Searched on Nov. 30, 2006. Abstract Only.

* cited by examiner

*Primary Examiner*—Stacy A Whitmore
(74) *Attorney, Agent, or Firm*—Fujitsu Patent Center

(57) ABSTRACT

A verification aiding apparatus includes an acquiring unit that acquires implementation description information of a verification target circuit, and a classifying unit that classifies registers in the verification target circuit for each type of processing for each command executable by the verification target circuit. Thus, implementation description classification information can be obtained. A setting unit performs a verification priority setting process and a generating unit performs a sequential command generating process, and a sequential command is output.

21 Claims, 11 Drawing Sheets

| COMMAND | REGISTER | | |
|---|---|---|---|
| | INPUT | REFERENCE | OUTPUT |
| X | A, B | D | B, C, D, F |
| Y | B | F | C |
| Z | A, E | -- | F |

COMMAND   REGISTER

→ OUTPUT REGISTER
⇢ REFERENCE REGISTER

| NAME | VERIFICATION PRIORITY | DESCRIPTION |
|---|---|---|
| R/R | 0 | READ AFTER READ |
| R/W | 3 | READ AFTER WRITE |
| W/R | 0 | WRITE AFTER READ |
| W/W | 1 | WRITE AFTER WRITE |

| FIRST \ AFTER | X | Y | Z |
|---|---|---|---|
| X | 3 | 3+1 | 1 |
| Y | 1 | 0 | 0 |
| Z | 1 | 3 | 0 |

FIG.10

| REFERENCE RULE | REFERENCE TARGET COMMAND | DETERMINING METHOD |
|---|---|---|
| R1 | — | RANDOM |
| R2 | IMMEDIATELY PREVIOUS COMMAND | COMMAND THAT FORMS HIGHEST TOTAL VERIFICATION PRIORITY WITH REFERENCE TARGET COMMAND |
| R3 | | COMMAND THAT FORMS HIGHEST TOTAL VERIFICATION PRIORITY FOR COMBINATION THAT HAS NOT APPEARED OF COMBINATIONS INCLUDING REFERENCE TARGET COMMAND |
| R4 | | COMMAND THAT FORMS LOWEST TOTAL VERIFICATION PRIORITY WITH REFERENCE TARGET COMMAND |
| R5 | PREVIOUS p COMMANDS | COMMAND THAT FORMS LOWEST TOTAL VERIFICATION PRIORITY FOR COMBINATION THAT HAS NOT APPEARED OF COMBINATIONS INCLUDING REFERENCE TARGET COMMAND |
| R6 | | COMMAND THAT FORMS HIGHEST TOTAL VERIFICATION PRIORITY WITH REFERENCE TARGET COMMAND |
| R7 | | COMMAND THAT FORMS LOWEST TOTAL VERIFICATION PRIORITY WITH REFERENCE TARGET COMMAND |
| ... | ... | ... |

316

METHOD AND APPARATUS FOR AIDING VERIFICATION OF CIRCUIT, AND COMPUTER PRODUCT

CROSS-REFERENCE TO RELATED APPLICATIONS

This application is based upon and claims the benefit of priority from the prior Japanese Patent Application No. 2006-260339, filed on Sep. 26, 2006, the entire contents of which are incorporated herein by reference.

BACKGROUND OF THE INVENTION

1. Field of the Invention

The present invention relates to a technology for aiding logic verification of digital circuits, particularly function verification of digital circuits.

2. Description of the Related Art

Conventionally, in many cases, function blocks and functions of modules and systems such as an encoder and a decoder for MPEG, and an inverse cosine conversion block inside are realized with commands including a series of process steps. A "command" represents, in addition to reading and writing, a bunch of functions such as "drawing a triangle" and "burst transferring" and can be invoked according to a series of process steps.

More specifically, the series of process steps refers to setting a value in each register; applying a trigger by setting a value in a predetermined register; executing an internal logic, thereby reading values in the registers and writing values into the registers; and obtaining the result of this execution. A command is executing according to this series of process steps.

For example, for a command of "drawing a triangle", a triangle can be drawn by setting in a register the coordinate values of the apexes of a triangle to be drawn, a trigger is applied, thereby executing an internal logic.

Function verification of the above function blocks, modules, and systems includes a verification approach in which an operation check of a single command is executed using a simulation by inputting the single command; and another verification approach in which a series of operation checks of commands is executed by execution of sequential simulations by inputting sequential commands.

For example, when operation checks are executed respectively for a command X indicating "drawing a triangle", a command Y indicating "drawing a tetragon", and a command Z indicating "changing the background color", according to the former verification approach of inputting a single command, the command X is first executed and the operation thereof is checked; after the register has been initialized, the command Y is executed and the operation thereof is checked; and after the register has been again initialized, the command Z is executed and the operation thereof is checked.

Though the verification approach of inputting a single command is an effective approach to check the basic operation according to the command, it is difficult to detect bugs.

According to the latter verification approach of inputting sequential commands, operation checks are executed by inputting sequentially the command X, the command Y, and the command Z and executing simulations sequentially. In this case, no register initialization between commands is executed, and in a state where values written by the previous command are held, a new command is executed.

In this manner, because a previous command depended on according to the verification approach of inputting sequential commands, the command Y executed later refers to the register into which values have been written by the command X previously executed, as a result, the command Y draws a wrong figure. Therefore, it is detected that bugs have been generated when the command Y is executed sequentially after the command X.

The approach of inputting the sequential commands assumes sequential operations that can occur actually. Therefore, this approach is effective because more bugs can be detected compared to the approach of inputting a single command.

The above approaches of inputting a single command and of inputting sequential commands have conventionally been adopted commonly on an actual site for design and verification. Japanese Patent Application Laid-Open Publication Nos. H5-151297, 2002-157145, and 2004-54549 are, for example, disclosed as known examples for the function verification.

However, though the verification approach of inputting sequential commands is very effective in detecting bugs, the number of combinations of sequential commands is enormous because the number of the commands executed on a digital circuit is originally enormous. For example, even when only 100 commands are executed as sequential commands each consisting of three commands of the 100 commands, one million sequential commands are present. Therefore, verification period becomes long if all of sequential commands are actually verified.

The enormous sequential commands includes many sequential commands that generate no bug and many sequential commands each of which includes commands that are not executed sequentially in actual operations. However, it is difficult to find such sequential commands from among all sequential commands, and to judge to what extent the verification must be executed. Therefore, at present, a bug can not be detected effectively.

SUMMARY OF THE INVENTION

It is an object of the present invention to at least solve the above problems in the conventional technologies.

A computer-readable recording medium according to one aspect of the present invention stores therein a verification aiding program causing a computer. The verification aiding program causes a computer to execute acquiring implementation description information of a circuit; classifying, for each of commands executable by the circuit, registers in the circuit that are used in execution of the commands into each type of processing by the commands, based on the implementation description information; and setting verification priority for each of combinations of a first command to be executed first and a second command to be executed sequentially after the first command that are selected from among the commands, the verification priority set depending on the combinations.

A computer-readable recording medium according to another aspect of the present invention stores therein a verification aiding program. The verification aiding program causes a computer to execute acquiring implementation description information of a circuit; classifying, for each of commands executable by the circuit, registers in the circuit that are used in execution of the commands into each type of processing by the commands, based on the implementation description information; comparing, for each of the commands, registers that are classified by type of processing executed by the commands according to a specification of the circuit and the registers classified at the classifying; and detecting a combination of which the processing is different from those according to the specification from among the combinations, based on a result of comparison at the comparing.

A verification aiding apparatus according to still another aspect of the present invention includes an acquiring unit that acquires implementation description information of a circuit; a classifying unit that classifies, for each of commands executable by the circuit, registers in the circuit that are used in execution of the commands into each type of processing by the commands, based on the implementation description information; and a setting unit that sets verification priority for each of combinations of a first command to be executed first and a second command to be executed sequentially after the first command that are selected from among the commands, the verification priority set depending on the combinations.

A verification aiding apparatus according to still another aspect of the present invention includes an acquiring unit that acquires implementation description information of a circuit; a classifying unit that classifies, for each of commands executable by the circuit, registers in the circuit that are used in execution of the commands into each type of processing by the commands, based on the implementation description information; a comparing unit that compares, for each of the commands, registers that are classified by type of processing executed by the commands according to a specification of the circuit and the registers classified by the classifying unit; and a detecting unit that detects a combination of which the processing is different from those according to the specification from among the combinations, based on a result of comparison by the comparing unit.

A verification aiding method according to still another aspect of the present invention includes acquiring implementation description information of a circuit; classifying, for each of commands executable by the circuit, registers in the circuit that are used in execution of the commands into each type of processing by the commands, based on the implementation description information; and setting verification priority for each of combinations of a first command to be executed first and a second command to be executed sequentially after the first command that are selected from among the commands, the verification priority set depending on the combinations.

A verification aiding method according to still another aspect of the present invention includes acquiring implementation description information of a circuit; classifying, for each of commands executable by the circuit, registers in the circuit that are used in execution of the commands into each type of processing by the commands, based on the implementation description information; comparing, for each of the commands, registers that are classified by type of processing executed by the commands according to a specification of the circuit and the registers classified at the classifying; and detecting a combination of which the processing is different from those according to the specification from among the combinations, based on a result of comparison at the comparing.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 10 illustrates a reference rule table;

DETAILED DESCRIPTION OF THE PREFERRED EMBODIMENTS

Exemplary embodiments according to the present invention will be explained in detail with reference to the accompanying drawings.

Figure 1:
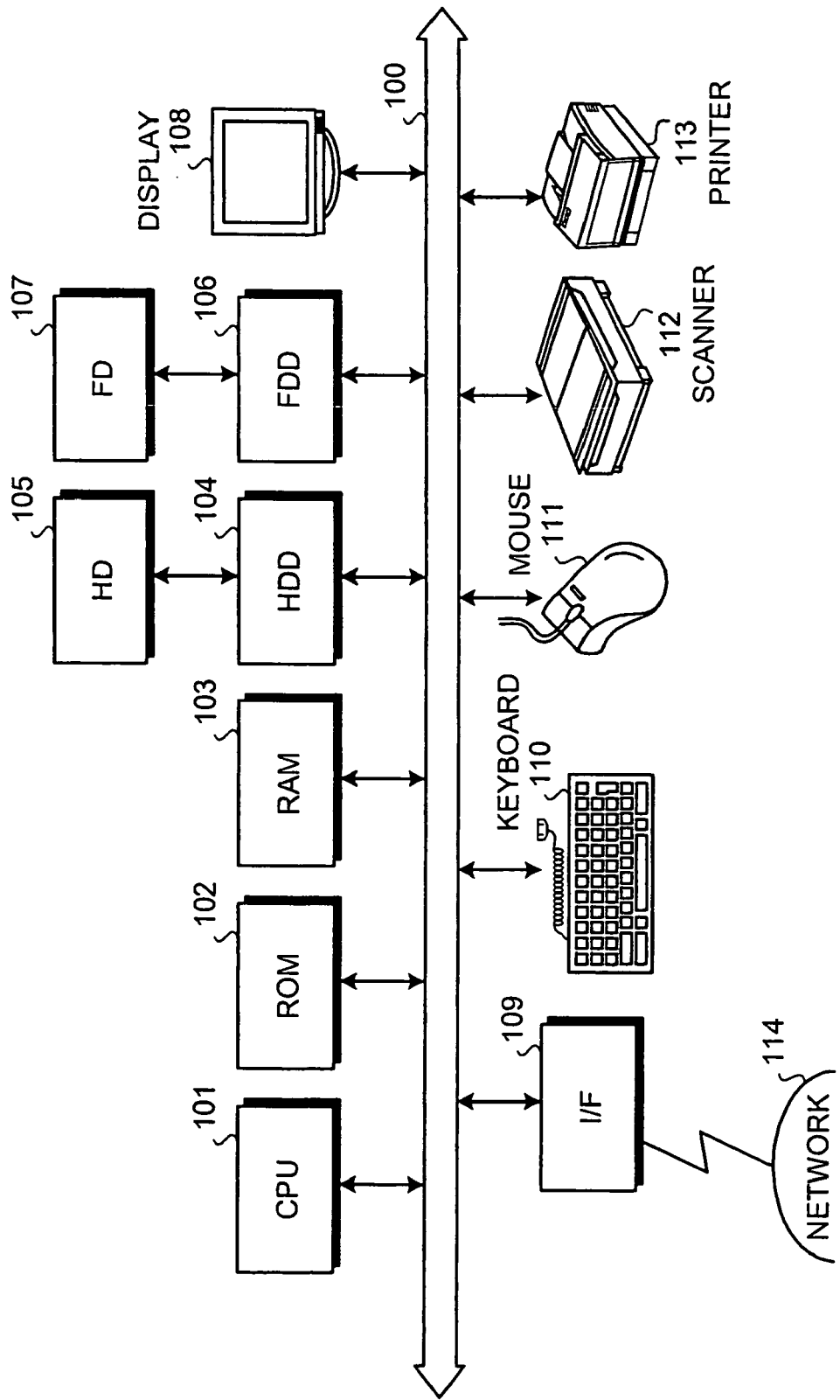
FIG. 1 depicts a hardware configuration of a verification aiding apparatus according to an embodiment of the present invention.

FIG. 1 depicts a hardware configuration of a verification aiding apparatus according to an embodiment of the present invention. As shown in FIG. 1, the verification aiding apparatus includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107 as an example of a removable recording medium, a display 108, an interface (I/F) 109, a keyboard 110, a mouse 111, a scanner 112, and a printer 113. Each component is connected by a bus 100 to each other.

The CPU 101 administers the control of the entire verification aiding apparatus. The ROM 102 stores programs such as a boot program. The RAM 103 is used by the CPU 101 as a work area. The HDD 104 controls reading/writing of data from/to the HD 105 according to the control of the CPU 101. The HD 105 stores data written according to the control of the HDD 104.

The FDD 106 controls reading/writing of data from/to the FD 107 according to the control of the CPU 101. The FD 107 stores the data written by the control of the FDD 106, causes the verification aiding apparatus to read the data stored in the FD 107, etc.

As a removable recording medium, not only the FD 107 but also a CD-ROM (CD-R, CD-RW), an MO, a DVD (Digital Versatile Disk), or a memory card may be used. In addition to a cursor, and icons or tool boxes, the display 108 displays data such as texts, images, and functional information. This display 108 may employ, for example, a cathode ray tube (CRT), a thin-film transistor (TFT) liquid crystal display, or a plasma display.

The I/F 109 is connected to a network 114 such as the Internet through a communication line and is connected to other apparatuses through this network 114. The I/F 109 administers an internal interface with the network 114 and controls input/output of data from/to external apparatuses. For example, a modem or an LAN adaptor may be employed as the I/F 109.

The keyboard 110 includes keys for inputting letters, numerals, various instructions, etc., and executes input of data. The keyboard 110 may be a touch-panel input pad or a numeric keypad. The mouse 111 executes move of the cursor, selection of a region, or move and size change of windows. The mouse 111 may be a track ball or a joy stick that similarly includes the function as a pointing device.

The scanner 112 optically reads images and captures image data into the verification aiding apparatus. The scanner 112 may have an optical character recognition (OCR) function. The printer 113 prints image data and text data. For example, a laser printer or an ink jet printer may be employed as the printer 113.

Figure 2:
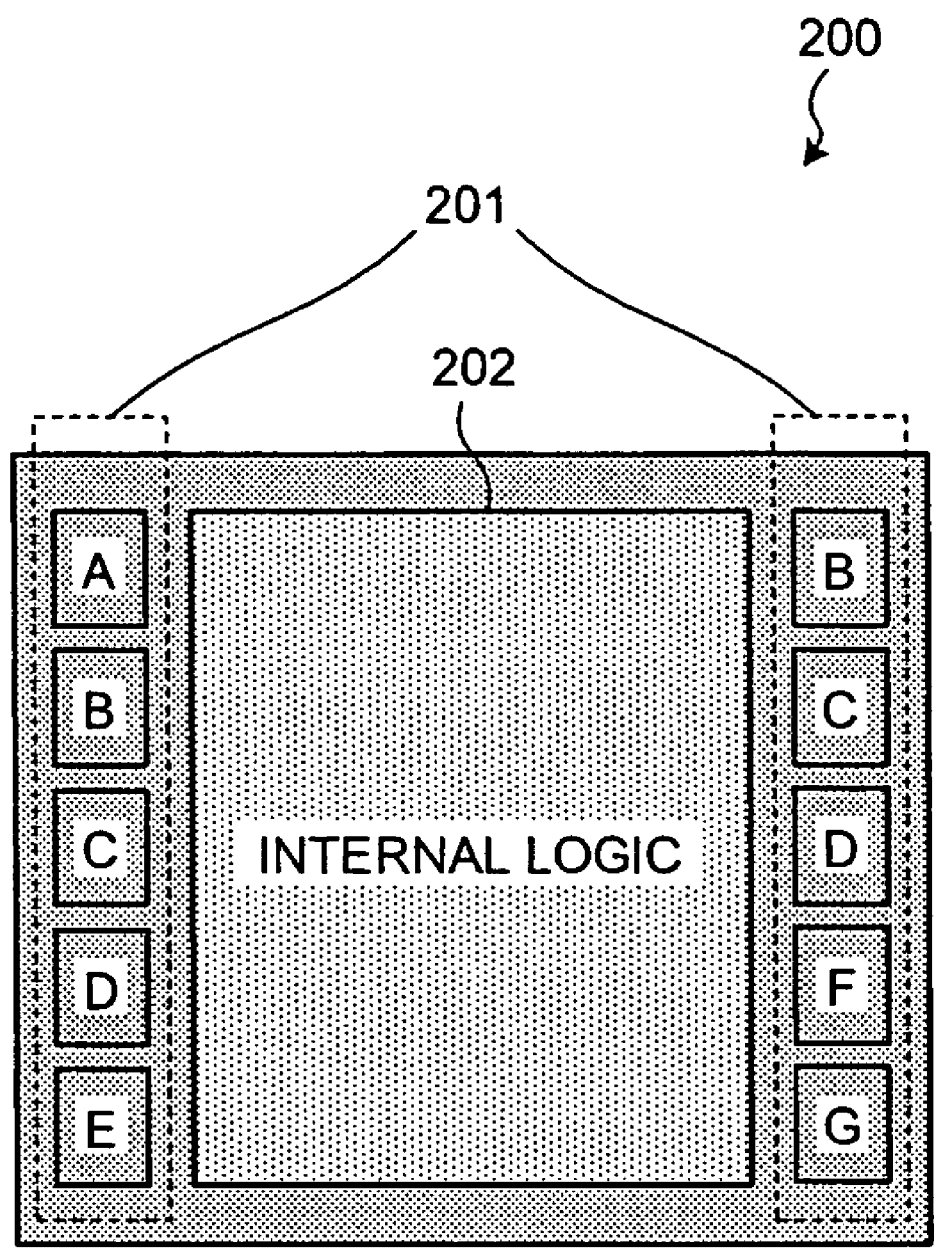
FIG. 2 is a schematic of a verification target circuit.

FIG. 2 is a schematic of a verification target circuit. A verification target circuit 200 is a digital circuit including a register group 201 including a plurality of interface registers (hereinafter, "registers") A to G, and an internal logic 202. Values corresponding to a command are set in; when the command is executed, values are written by an operation of the internal logic 202 in; and retained values are read from each of the registers A to G.

Figure 3:
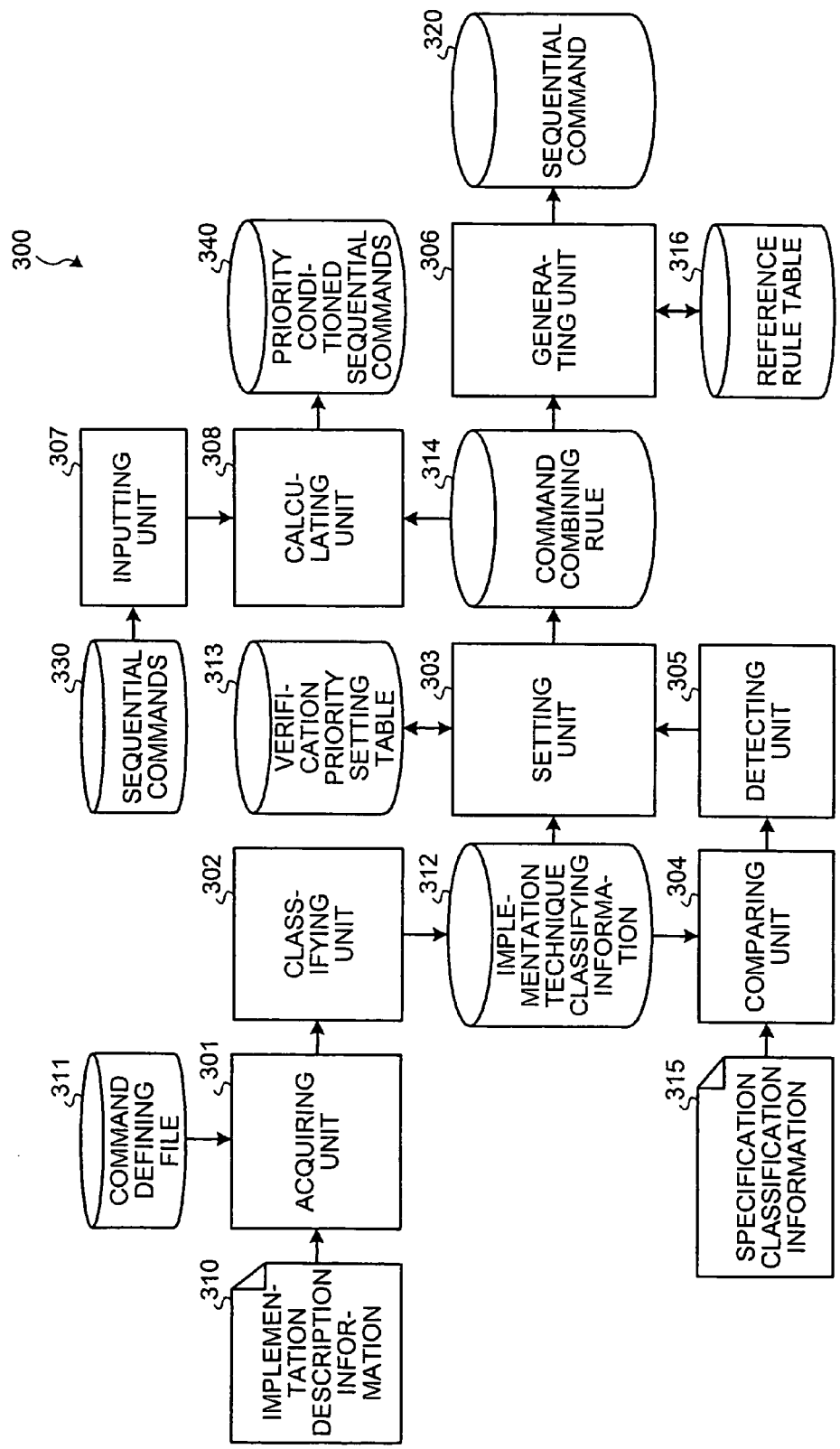
FIG. 3 is a block diagram of the verification aiding apparatus.

FIG. 3 is a block diagram of the verification aiding apparatus. As shown in FIG. 3, a verification aiding apparatus 300 includes an acquiring unit 301, a classifying unit 302, a setting unit 303, a comparing unit 304, a detecting unit 305, a generating unit 306, an inputting unit 307, and a calculating unit 308.

More specifically, the above functional configuration realizes the functions thereof by causing the CPU 101 to execute a program recorded in a recording medium such as the ROM 102, the RAM 103, and the HD 105 shown in FIG. 1, or by the I/F 109.

The acquiring unit 301 has a function of acquiring implementation description information 310 of the verification target circuit 200, and also has a function of acquiring a command defining file from a command defining file group 311. The implementation description information 310 includes hardware description language (HDL) description information of a register transfer level (RTL) of the verification target circuit 200 and a net list that shows the result of the logic synthesis by the circuit 200.

The command defining file group 311 is a set of command defining files concerning types of commands and the command defining file is a file that has description of the contents of execution of the command.

As described above, a command represents, in addition to reading and writing, a bunch of functions such as "drawing a triangle" and "burst transferring" and can be invoked according to a series of process steps. By reading the implementation description information 310 of the verification target circuit 200, the acquiring unit 301 reads from the command defining file group 311 a command defining file of a command executable by the verification target circuit 200.

The classifying unit 302 has a function of classifying the registers A to G in the verification target circuit 200 used in execution of commands into each type of processing contents by a command, for each command executable by the verification target circuit 200 based on the implementation description information 310, and outputs the implementation description classification information 312 as the classification result.

More specifically, the register to be updated (hereinafter, "output register") is detected by, for example, exploring the internal logic 202 based on the implementation description information 310 and obtaining the range of influence, with a register that is set when a command is executed (hereinafter, "input register") as the starting point. The register to be referenced (hereinafter, "reference register") is detected by tracing back the internal logic 202 from the output register.

That is, values are set in the input register when the command is executed, the values are updated in the output register when the command is executed, and the reference register is the register from which the values are read when the command is executed.

Such a classifying process can be realized using a signal propagation analysis described in Japanese Patent Application Laid-Open Publication No. 2006-190209, a known signal flow analysis (http://portal.acm.org/affiliated/citation.cfm?id=1119797&d 1=acm&coll=GUIDE&CFID=15151515&CFTOKEN= 6184618), or a symbol simulation (http://www.eetimes.com/news/latest/showArticle.jhtml?artic leID=18303007).

Figures 4, 5:
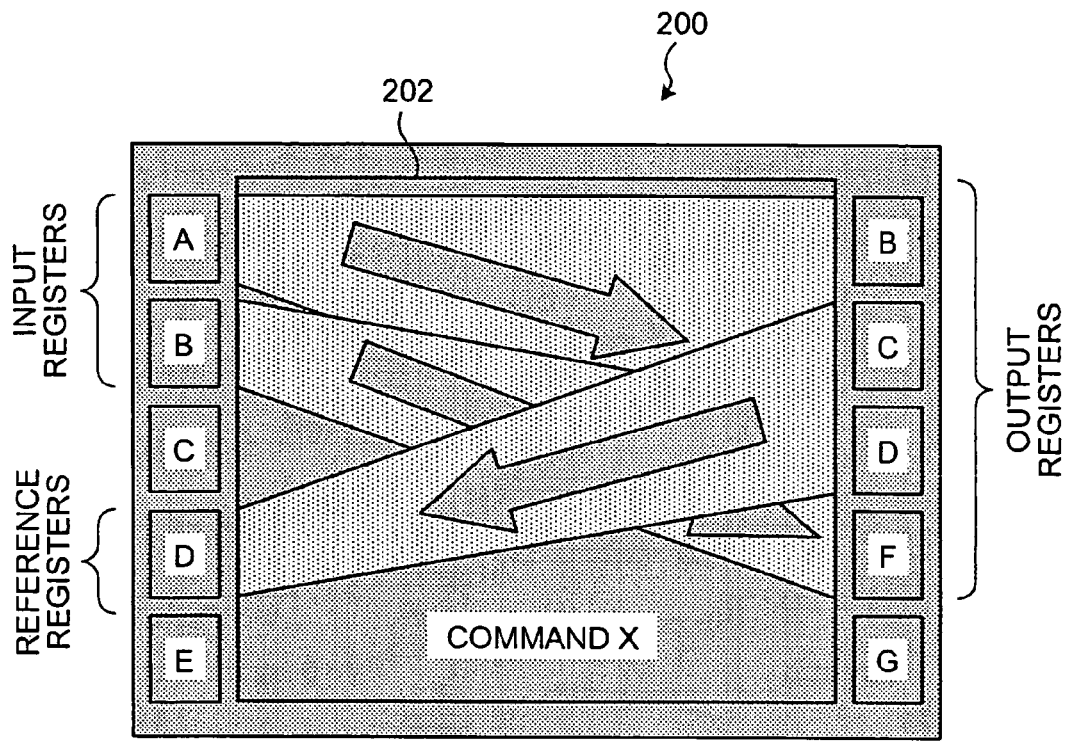
FIG. 4 is a schematic for illustrating a result of execution analysis of a command X.
FIG. 5 is a chart of implementation description classification information for commands X to Z.

FIG. 4 is a schematic for illustrating a result of execution analysis of the command X. In the example shown in FIG. 4, when the command X is executed, of the registers A to G, the registers A and B are classified as input registers; the register D is classified as a reference register; and the registers B, C, D, and F are classified as output registers. In this manner, in addition to the command X, by executing other commands (for example, the commands Y and Z), the registers in the verification target circuit 200 used for the execution of the commands are classified into each type of processing contents by a command for each command.

Figures 6, 7, 8:
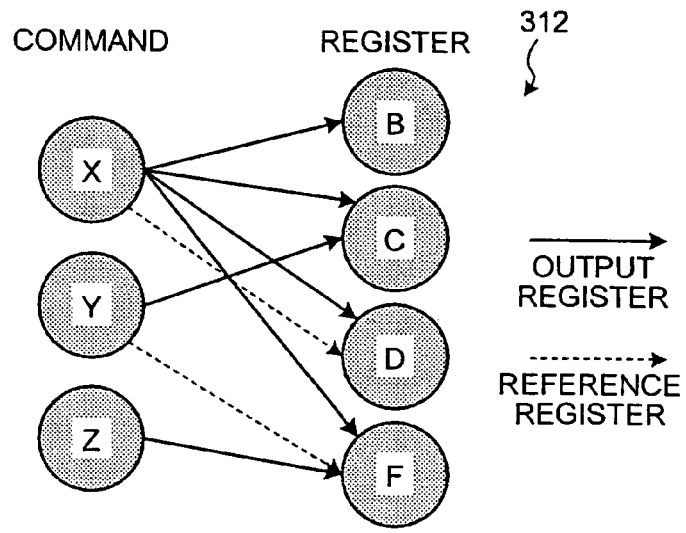
FIG. 6 depicts the implementation description classification information for the commands X to Z.
FIG. 7 illustrates a verification priority setting table.
FIG. 8 is a chart for explaining an example of a command combining rule.

FIG. 5 is a chart of implementation description classification information 312 for the commands X to Z. FIG. 6 depicts the implementation description classification information 312 for the commands X to Z. In FIG. 6, a solid line arrow represents an "output register" and a dotted line arrow represents a "reference register". In FIG. 6, the correspondence between the commands X to Z and the input registers is omitted.

For each combination of a command to be executed first and a command to be executed thereafter selected from a set of commands for which the registers have been classified into each type of processing contents by the classifying unit 302, the setting unit 303 has a function of setting verification priority corresponding to the combination. The verification priority is an index indicating the likelihood of occurrence of bugs and can be represented by a value. When the verification priority is represented by a value, bugs tend to occur more and the verification priority becomes higher as the value becomes large, and bugs tend to occur less and the verification priority becomes lower as the value becomes small.

More specifically, the setting unit 303, for example, refers to the implementation description classification information 312 and sets the verification priority for each combination including a pair of sequential commands. Combinations for which bugs tend to occur, that is, combinations each having high verification priority include, for example, a combination for which a writing process is executed according to a command of the combination to be executed first and a reading process is executed according to a command of the combination to be executed thereafter to a same register (read after write, hereinafter, "R/W process") and a combination for which a writing process is executed according to a command of the combination to be executed first and another writing process is executed according to a command of the combination to be executed thereafter to a same register (write after write, hereinafter, "W/W process").

Combinations for which bugs tend not to occur, that is, combinations each having low verification priority include, for example, a combination for which a reading process is executed according to a command of the combination to be executed first and a reading process is executed according to a command of the combination to be executed thereafter to a same register (read after read, hereinafter, "R/R process") and a combination for which a reading process is executed according to a command of the combination to be executed first and a writing process is executed according to a command of the combination to be executed thereafter to a same register (read after write, hereinafter, "R/W process").

Hereinafter, the processing contents associated with the sequential execution of commands like an R/W process, a W/W process, an R/R process, and a W/R process are referred to as "sequential processing contents".

For example, referring to the implementation description information 312 shown in FIG. 5, the register F is classified as an output register for the command X and the register F is classified as a reference register for the command Y. Therefore, in the case where the command Y is executed after the command X has been executed (an R/W process), when the values of the register F are referred to in the latter execution of the command Y, the values are the values that have been written into the register F by the command X executed first.

Therefore, the execution result of the command Y depends on the execution result of the command X executed first. In other words, bugs tend to occur when the writing process according to the command X has been failed and bugs also tend to occur when the reading process according to the command Y has been failed. Therefore, combinations each corresponding to an R/W process have the highest probability of bug occurrence and, therefore, the highest verification priority is set therefor.

Similarly, the register F is an output register for the command X and the register F is also an output register for the command Z. Therefore, in the case where the command Z is executed after the command X has been executed (a W/W process), when the values for the register F are written in the execution of the command Z, the values written into the register F for the command X executed first are overwritten.

In this manner, when the writing process according to the command Z executed later is failed, bugs tend to occur because the values written into the register F according to the command X executed first are retained while no influence is exerted even when the writing process according to the command X executed first is failed in the case where the writing process according to the command Z executed later is executed normally.

Therefore, each of the combinations corresponding to a W/W process has a lower probability of bug occurrence than each of the combinations corresponding to an R/W process and, therefore, the verification priority therefor is also set to be lower. However, each of the combinations corresponding to a W/W process has a higher probability of bug occurrence than each of the combinations corresponding to an R/R process or a W/R process and, therefore, the verification priority thereof is also set higher. More specifically, it is preferable to use a verification priority setting table for such setting of the verification priority.

FIG. 7 illustrates a verification priority setting table 313. In the verification priority setting table 313, the verification priority of an R/W process that has the highest probability of bug occurrence is "3", the verification priority of a W/W process that has the second highest probability of bug occurrence is "1", and the verification priority of each of the remaining R/R process and W/R process is "0".

Using the verification priority setting table 313 shown in FIG. 7, for each combination of any two commands of the commands X to Z, the verification priority is set. The result of this setting is employed as a rule common to combinations each including sequential commands (hereinafter, a "command combining rule").

FIG. 8 is a chart for explaining an example of a command combining rule 314. In FIG. 8, for the simplicity of the description, input commands are not considered. According to the command combining rule 314, the verification priority of a combination of a command executed first and a command executed later corresponds to crossed values.

For example, when the command executed first is the command X and the command executed later is the command X, the verification priority is "3" because an R/W process is executed to the register D. Similarly, when the command executed first is the command X and the command executed later is the command Y, the verification priority in this case is "3+1=4" because an R/W process is executed to the register D and a W/W process is executed to the register C.

The comparing unit 304 shown in FIG. 3 has a function of comparing, for each command, a register classified by type of processing contents by a command according to a specification of the verification target circuit 200 with a register for each type of processing contents classified by the classifying unit 302. More specifically, for example, the comparing unit 304 compares specification classification information 315 with the implementation description classification information 312.

The specification classification information 315 is information obtained by a user by classifying the registers A to G into each type of processing contents by a command based on the contents described in the specification of the verification target circuit 200, and organizing and computerizing the classification result as in the implementation description classification information 312. The comparing unit 304 compares the specification classification information 315 with the implementation description classification information 312 for each of the registers A to G.

The detecting unit 305 has a function of detecting, based on the comparison result compared by the comparing unit 304, combinations, each including a command to be executed first and a command to be executed thereafter that have been selected from the set of commands for which the registers A to G are classified into each type of processing contents of the commands by the classifying unit 302, and each having processing contents different from that according to the specification.

More specifically, for example, the detecting unit 305 detects combinations each having the sequential processing contents that differ depending on whether the specification classification information 315 or the implementation description classification information 312 is to be based on from combinations including a command to be executed first and a command to be executed thereafter.

Figure 9:
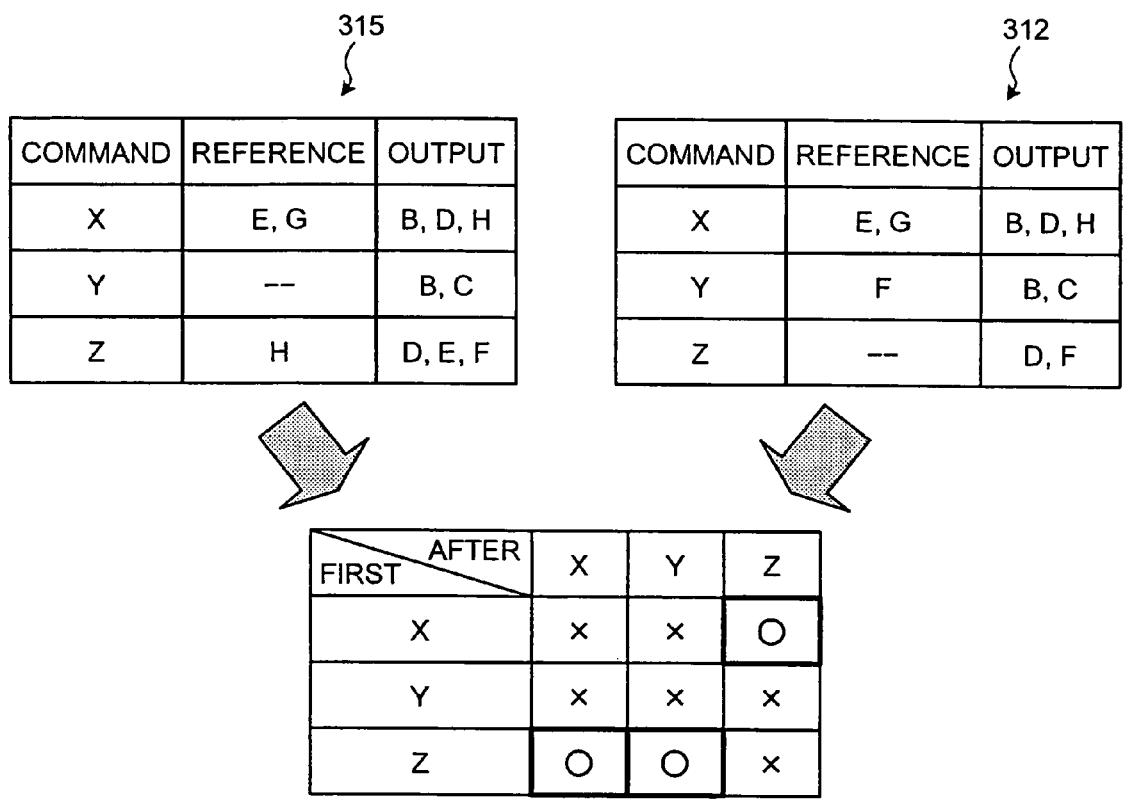
FIG. 9 is a schematic for explaining an example of comparison and detection performed by a comparing unit and a detecting unit.

FIG. 9 is a schematic for explaining an example of the comparison and the detection by the comparing unit 304 and the detecting unit 305 respectively. In FIG. 9, comparing the specification classification information 315 with the implementation description classification information 312, the points that are detected as the comparison result are that, for the command Y, the specification classification information 315 lists no reference register, whereas, the implementation description classification information 312 lists the register F classified as a reference register; that, for the command Z, the specification classification information 315 lists the register H classified as a reference register, whereas, the implementation description classification information 312 lists no reference register; and that, for the command Z, the specification classification information 315 lists the register E classified as an output register, whereas, the implementation description classification information 312 lists the register E not classified as an output register.

Thus, when the command Z is executed after the command X has been executed, for the register H, though an R/W process is executed according to the specification classification information 315, only a writing process according to the command X is executed according to the implementation description classification information 312. Therefore, the contents of the sequential processing are different.

When the command X is executed after the command Z has been executed, for the register E, though an R/W process is executed according to the specification classification information 315, only a reading process according to the command X is executed according to the implementation description classification information 312. Therefore, the contents of the sequential processing are different.

When the command Y is executed after the command Z has been executed, for the register F, though a writing process according to the command Z is executed according to the specification classification information 315, an R/W process is executed according to the implementation description classification information 312. Therefore, the contents of the sequential processing are different. In FIG. 9, the detection result is represented by a "circle" or a "cross". The "circle" represents a combination for which the contents of the sequential processing differ between the specification classification information 315 and the implementation description classification information 312. The "cross" represents a combination for which the contents of the sequential processing are same for both of the specification classification information 315 and the implementation description classification information 312.

The combination for which the contents of the sequential processing differ between the specification classification information 315 and the implementation description classification information 312 is the result of a design mistake and, therefore, is considered to have a high probability of bag occurrence. Therefore, the setting unit 303 may set the verification priority for each combination also using such a detection result.

The generating unit 306 shown in FIG. 3 has a function of generating sequential commands 320 executable by the verification target circuit 200 by lining up the commands in the time sequence based on the verification priority of each combination set by the setting unit 303.

For example, the generating unit 306 generates the sequential commands 320 by lining up newly the command having the highest verification priority of the commands that are the candidates for the combination with at least the command at the tail already lined up in the time sequence. The generating unit 306 may generate the sequential commands 320 by lining up newly a command that have not appeared of the commands that are the candidates for the combination with at least the command at the tail already lined up in the time sequence.

The generating unit 306 may also generate the sequential commands 320 by lining up newly the command having the highest verification priority of the commands that have not appeared and are the candidates for the combination with at least the command at the tail already lined up in the time sequence. In the above generating process of the sequential commands 320, more specifically, for example, it is preferable to generate the sequential commands 320 using the command combining rule 314. When the sequential commands 320 are generated, for example, a command to be disposed next to the command at the tail in the command line already disposed can be determined according to the reference rule.

FIG. 10 illustrates a reference rule table 316. The reference rule table 316 shows a reference target command and the determining method of the command to be newly lined up for each of the reference rules R1, R2, . . . .

A reference target command is an arbitrary command in the command line already disposed. More specifically, the reference target command may be, for example, a command immediately before the reference target command (a command at the tail in the time sequence) or a pth command in the reverse time sequence (p≧2, p can be set arbitrarily).

The determining method may also be set variously such as "at randomly" or "the command having the highest verification priority". Specific reference rules may be applied to specific sequential commands 320 as these reference rules R1, R2, . . . , and the reference rules may be changed every time a command is added newly in the line.

The reference rule R1 has no reference target command and randomly determines a command to be disposed newly. The reference rule R2 determines a command that has the highest verification priority (value) for the reference target command to be the command to be disposed newly. For example, using the command combining rule 314, the command to be disposed newly is the command Y when the reference target command is the command X.

The reference rule R3 determines a command that has the highest verification priority (value) for a combination that has not been appeared of the combinations each with the reference target command, to be a command to be disposed newly. For example, using the command combining rule 314, the command to be disposed newly is the command X when the reference target command is the command X and a command combination (X, Y) has already appeared.

The reference rule R4 determines a command that has the lowest verification priority (value) for the reference target command to be a command to be disposed newly. For example, using the command combining rule 314, the command to be disposed newly is the command Z when the reference target command is the command X.

The reference rule R5 determines a command that has the lowest verification priority (value) for a combination that has not been appeared of the combinations each with the reference target command, to be a command to be disposed newly. For example, using the command combining rule 314, the command to be disposed newly is the command Z when the reference target command is the command X and the command combination (X, Y) has already appeared.

The reference rule R6 determines a command that forms the highest total verification priority (value) with the reference target commands, to be a command to be disposed newly. In this case, the reference target commands are the previous two (p=2) commands. For example, using the command combining rule 314, the command to be disposed newly is the command Y when the reference target command is a command string XZ.

The reference rule R7 determines a command that forms the lowest total verification priority (value) with a command that has not appeared of the reference target commands, to be a command to be disposed newly. In this case, the reference target commands are the previous two (p=2) commands. For example, using the command combining rule 314, the command to be disposed newly is the command Z when the reference target command is a command string XZ.

Figure 11:
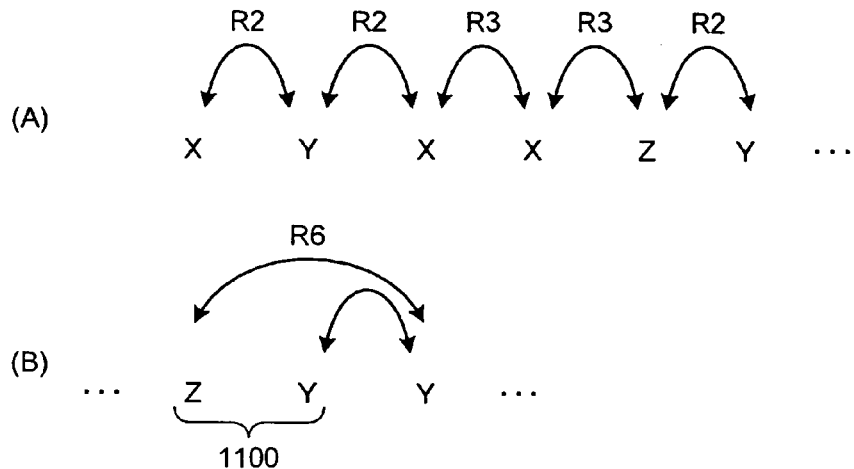
FIG. 11 is a schematic for explaining generation of a sequential command.

FIG. 11 is a schematic for explaining generation of the sequential command 320. In FIG. 11, the command at the top-left is a head command and commands are lined up therefrom toward the right in the time sequence. In (A), the command Y having the highest verification priority is disposed by applying the reference rule R2 to the head command X. By applying the reference rule R2 to this command Y, the command X having the highest verification priority is disposed.

By applying the reference rule R3 to this command X, the combination having the highest verification priority is a command string XX. Therefore, the command X is disposed. By applying the reference rule R3 to this command X, the combination having the highest verification priority is a command string XZ. Therefore, the command Z is disposed. By applying the reference rule R2 to this command Z, the command Y having the highest verification priority is disposed. In this manner, the sequential commands 320 can be generated.

In (B), applying the reference rule R6, a command that forms the highest total verification priority (value) with the previous p (p=2) commands is disposed. More specifically, the command Y that forms the highest total verification priority with the command Z and the command Y in a command string ZY for the previous two times denoted by a reference numeral 1100 is disposed next to the command string ZY. The sequential commands 320 can be generated also in this manner.

The inputting unit 307 shown in FIG. 3 has a function of receiving an input of sequential commands 330 selected arbitrary by a user (that differ from the sequential commands 320 generated automatically). More specifically, the commands to be received are not necessarily the sequential commands 330 themselves and the input of identification information of at least the sequential commands 330 may be received. The identification information of the sequential commands 330 refers to character string data (for example, XXZYZXY . . . ) that specifies a command string.

The calculating unit 308 has a function of calculating the validity of the sequential commands 320 based on the identification information of the sequential commands 330 input by the inputting unit 307 and the verification priority set by the setting unit 303, and outputs a priority conditioned sequential commands 340 as the calculation result.

More specifically, for example, the calculating unit 308 reads the verification priority of sequential command strings according to the command combining rule 314 and calculates the total thereof as the validity. That is, the validity is an index to judge by digitization whether the sequential commands provided as the identification information from the inputting unit 307 are a command string for which bags tend to occur or a command string for which bags tend not to occur.

Figure 12:
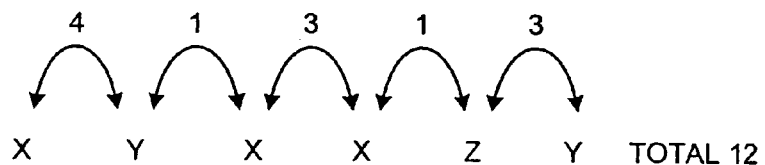
FIG. 12 is a schematic for explaining calculation of validity.

FIG. 12 is a schematic for explaining calculation of the validity. In FIG. 12, the verification priority is extracted, for example, as follows: the verification priority corresponding to a combination including the command X that is the head command and the command Y executed thereafter is "4"; the verification priority corresponding to a combination including the command Y and the command X executed thereafter is "11"; etc., and the total thereof "12" is the validity. When the validity is calculated, a combination does not necessarily include an adjacent previous command and, for example, the verification priority of the previous two commands may be extracted and the total thereof may be the priority.

Figure 13:
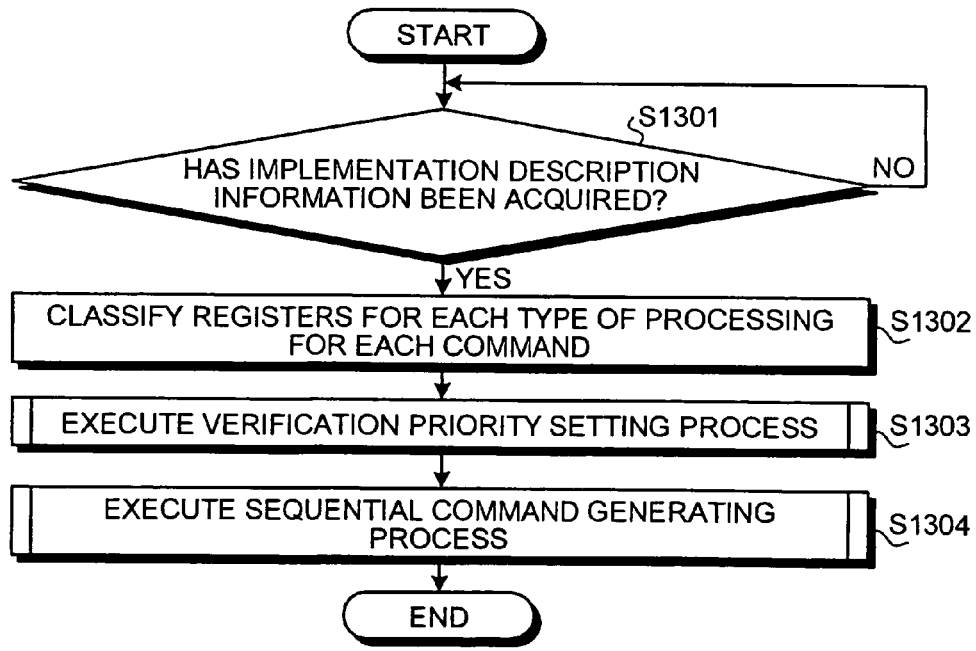
FIG. 13 is a flowchart of a verification aiding process according to the embodiment.

FIG. 13 is a flowchart of the verification aiding process according to the embodiment. The acquiring unit 301 is waited for to acquire the implementation description information 310 of the verification target circuit 200 (step S1301: NO); when the acquiring unit acquires the implementation description information 310 (step S1301: YES), the classifying unit 302 classifies registers in the verification target circuit 200 into each type of processing contents for each command executable by the verification target circuit 200 (step S1302). Thus, the implementation description classification information 312 can be obtained.

Thereafter, by executing a verification priority setting process using the setting unit 303 (step S1303) and a sequential commands generating process (step S1304) using the generating unit 306, the series of process steps are ended.

Figure 14:
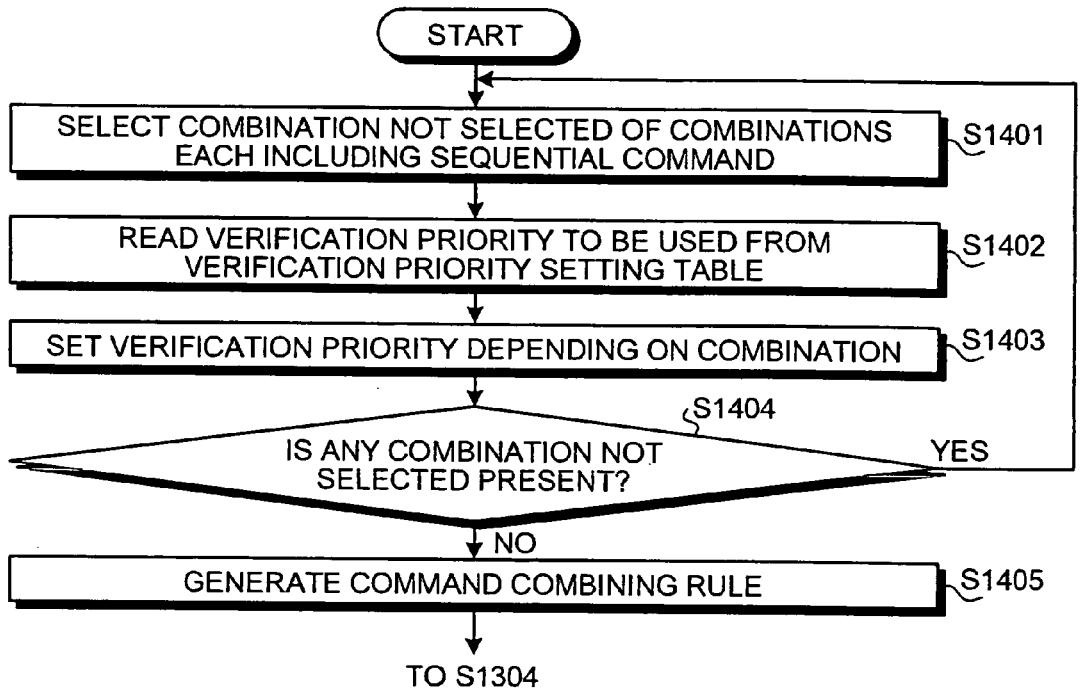
FIG. 14 is a flowchart of a verification priority setting process shown in FIG. 13.

FIG. 14 is a flowchart of the verification priority setting process (step S1303). As shown in FIG. 14, the setting unit selects a combination having not been selected of the combinations each including sequential commands (step S1401), and reads the verification priority that corresponds to a process (a W/R process, a W/W process, an R/R process, or an R/W process) corresponding to the combination selected from the verification priority setting table 313 (step S1402).

For example, when a combination including a command to be executed first and a command to be executed thereafter includes the commands X and Y, the register F is a register to which the R/W process is executed and, therefore, the verification priority "3" is read, and the register C is a register to which the W/W process is executed and, therefore, the verification priority "1" is read.

The verification priority corresponding to the combination is set (step S1403). More specifically, by taking the total of the pieces of verification priority having been read, the verification priority corresponding to the combination is set. Taking the example of the above combination of the commands X and Y, the verification priority corresponding to the combination of commands X and Y is "4" because the pieces of verification priority "3" and "1" are read.

Whether a combination including any command having not selected is present is judged (step S1404) and, when the combination having not been selected is present (step S1404: YES), the procedure is returned to step S1401. When no combination having not been selected is not present (step S1404: NO), the command combining rule 314 is generated by totaling pieces of verification priority respectively corresponding to combinations (step S1405). The procedure is advanced to the sequential command generating process (step S1304). Description will be given for the sequential command generating process shown at step S1304.

Figure 15:
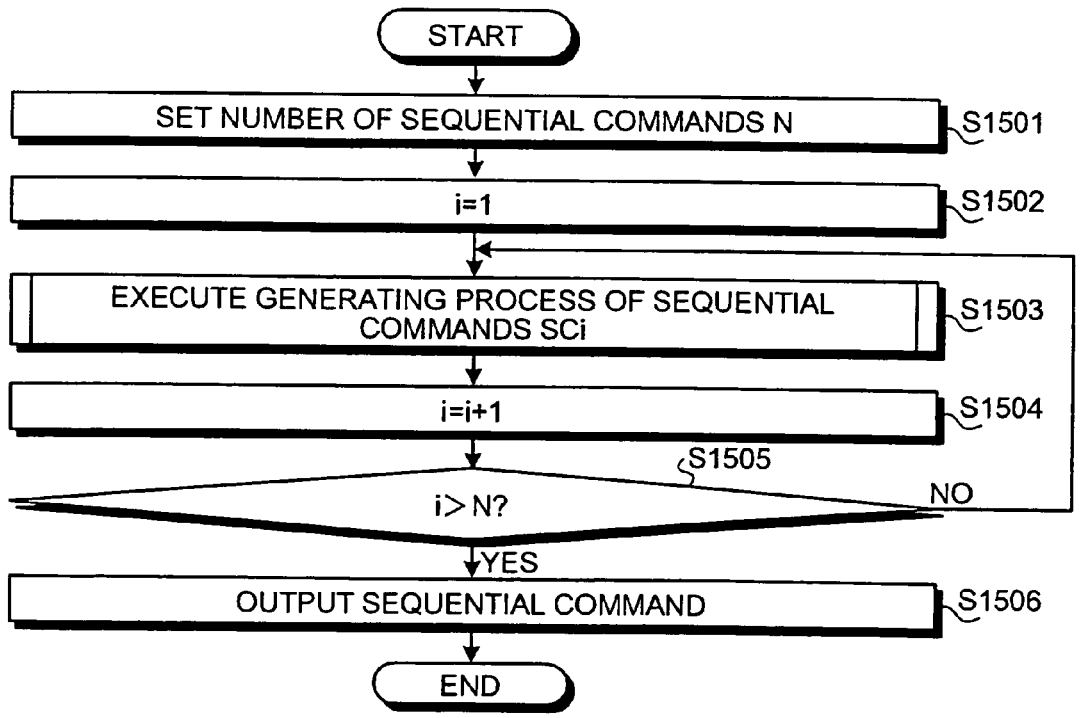
FIG. 15 is a flowchart of a sequential command generating process shown in FIG. 13.

FIG. 15 is a flowchart of the sequential command generating process (step S1304). In FIG. 15, the number N of sequential commands desired by the user is set (step S1501). Thus, a generating process of N kinds of the sequential commands 320 is started.

Setting an index number to be i=1 (step S1502), a generating process of the ith sequential command 320 (hereinafter, "sequential command SCi") is executed (step S1503). When the sequential command SCi is generated, the index number i is incremented by one (step S1504) and whether i>N is judged (step S1505). When i is not i>N (step S1505: NO), the procedure is returned to step S1503. When i is i>N (step S1505: YES), the N kinds of the sequential commands 320 generated are output (step S1506). Thus, the series of process steps is ended.

Figure 16:
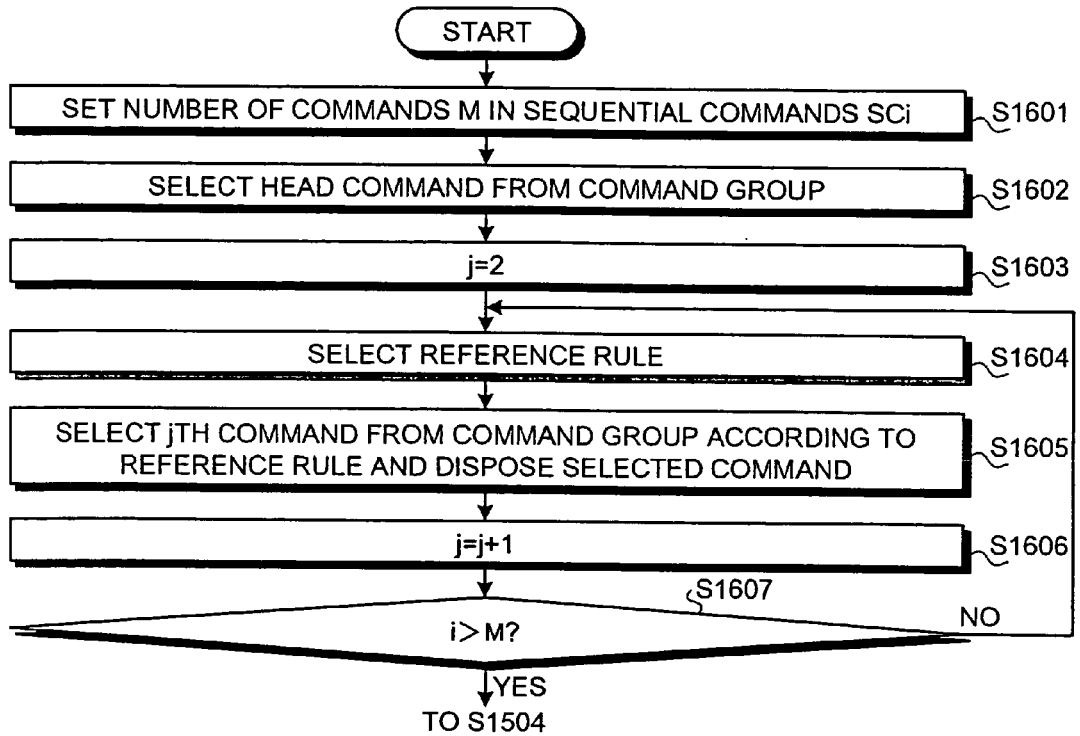
FIG. 16 is a flowchart of a generating process of sequential commands SCi shown in FIG. 15.

FIG. 16 depicts a flowchart of the generating process (step S1503) of the sequential command SCi. As shown in FIG. 16, the number M of commands in the sequential commands SCi is set (step S1601). This setting may be executed together with the setting of the number N of sequential commands.

The verification target circuit 200 selects a head command from an executable command group (step S1602). An index number j is set as j=2 (step S1603). The index number j is a variable representing order of disposition (or order of execution) of a command. "j=1" represents the disposition order of the head command. That is, the jth command is a command executed immediately after the (j−1)th command.

A reference rule is selected from the reference rule table 316 (step S1604). According to the reference rule selected, an ith command to be executed immediately after the command (the (j−1)th command) immediately before the command is selected and disposed from the executable command group using the verification target circuit 200 (step S1605).

The index number j is incremented by one (step S1606) and whether j>M is judged (step S1607). When j is not j>M (step S1607: NO), the procedure is returned to step S1604. When j is j>M (step S1607: YES), the procedure is advanced to step S1504.

As above, according to the process procedure shown in FIGS. 13 to 16, the verification priority is set to be high when the contents of the sequential processing has a depending relation between each other as the R/W process and W/W process, because the verification priority corresponding to a combination including sequential commands is set according to the contents of the sequential processing thereof to a same register. Thus, the sequential commands 320 for which bugs tend to occur can be automatically generated.

The verification priority is set to be low when the contents of the sequential processing have no depending relation between each other as the R/R process and W/R process. Thus, generation of the sequential commands 320 for which bugs tend not to occur can be suppressed. Because the sequential commands 320 for which bugs tend not to occur can also be automatically generated, the sequential commands 320 that are obviously not necessary to be input sequentially can be recognized.

Figure 17:
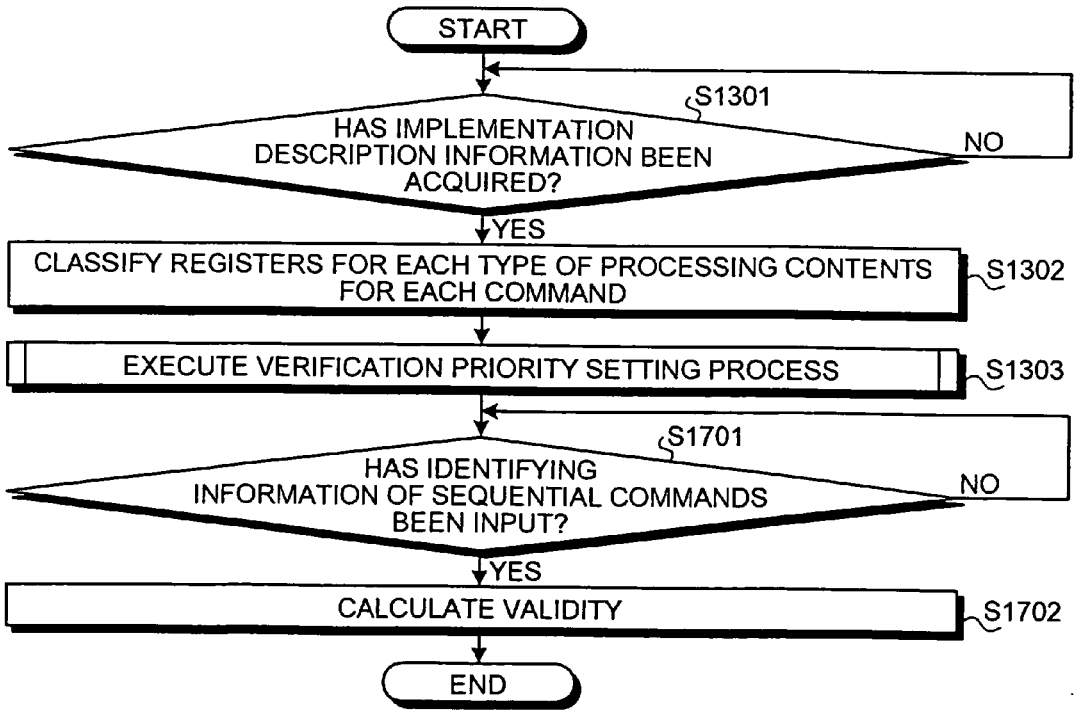
FIG. 17 is a flowchart of a verification aiding process according to the embodiment.

FIG. 17 depicts a flowchart of a second example of the verification aiding process according to the embodiment. A process of calculating the validity of the sequential commands 330 prepared in advance executed by the inputting unit 307 and the calculating unit 308 is added to the first example after the verification priority setting process (step S1303). The processing contents same as those of the first example shown in FIG. 13 are given the same step numbers and the description thereof is omitted.

In FIG. 17, after the execution of steps S1301 to S1303, the inputting unit 307 is waited for to input identification information of the sequential commands 330 (step S1701: NO). When the identification information of the sequential commands 330 is input (step S1701: YES), the calculating unit 308 calculates the validity thereof (step S1702). Thus, the series of process steps are ended.

Evaluation of whether the sequential commands 330 prepared in advance are sequential commands for which bugs tend to occur can be executed. The priority conditioned sequential commands 340 are output by calculating the validity for the plurality of sets of sequential commands 330. Thus, relative ranks concerning the probability of bug occurrence can be obtained and the sequential commands to be verified with priority can be recognized. Therefore, the effective use of the verification resources can be facilitated.

FIG. 13 depicts a flowchart of a third example of the verification aiding process according to the embodiment. A processes executed by the comparing unit 304 and the detecting unit 305 is added to the process procedure of the first example. The processing contents same as those of the first example shown in FIG. 13 are given the same step numbers and the description thereof is omitted.

Figure 18:
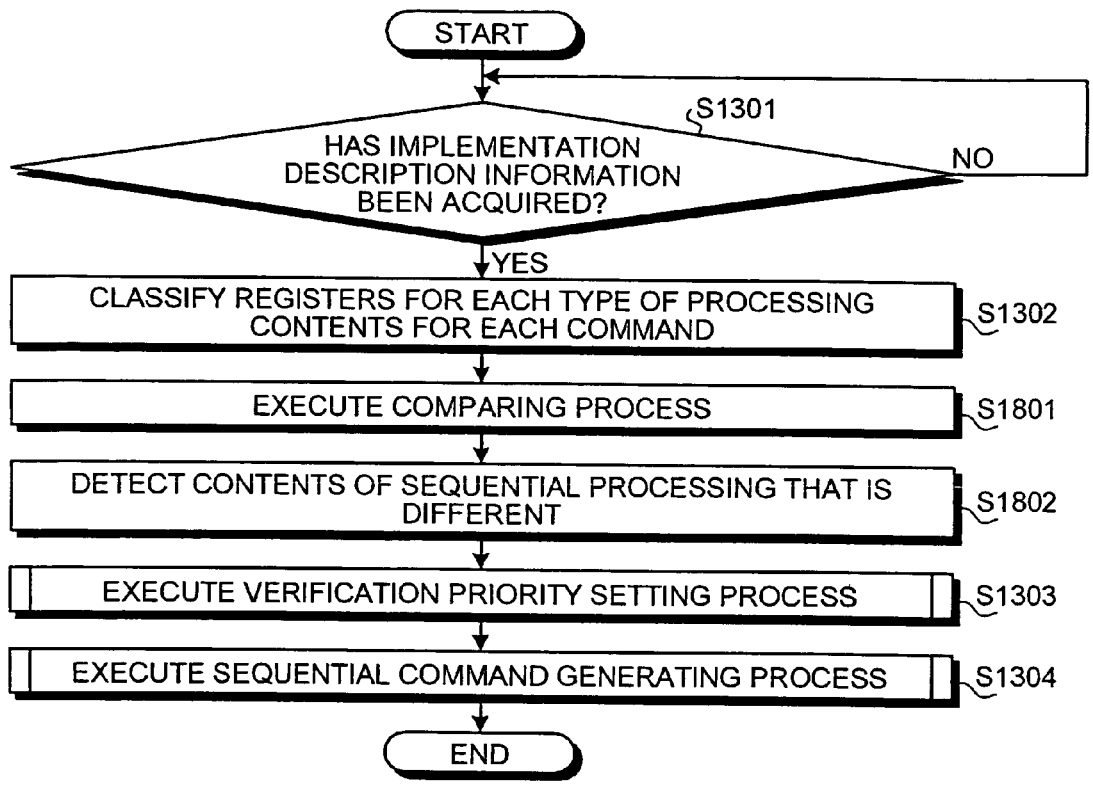
FIG. 18 is a flowchart of a verification aiding process according to the embodiment.

As shown in FIG. 18, after steps S1301 to S1302, the comparing unit 304 reads the specification classification information 315 and compares this information 315 with the implementation description classification information 312 (step S1801). Due to the comparing process, different points in registers classified for each command are detected between the specification classification information 315 and the implementation description classification information 312.

The detecting unit 305 detects for each combination of sequential commands the contents of the sequential processing that differ between the specification classification information 315 and the implementation description classification information 312 (step S1802). The difference between the implementation description information 310 and the specification can be discovered by outputting the detection result (as screen display or as printed output). That is, the gap between the recognition of the design engineers potentially present in the specification and the recognition of the implementation engineers potentially present in the implementation description information 310 can be made obvious.

After the detection, the verification priority setting process is executed using the detection result (step S1303). More specifically, the detection result obtained at step S1802 is used in the process at step S1403 shown in FIG. 14. For example, because it is considered that bugs tend to occur when different points are detected for the combination, the verification priority may be increased by predetermined points.

After the verification priority setting process (step S1303), the sequential commands 320 for which the difference between the implementation description information 310 and the specification is considered can be obtained by executing the sequential commands generating process (step S1304). After the verification priority setting process (step S1303), the validity of the sequential commands 320 prepared in advance may be calculated as steps S1701 to S1702.

As above, according to the embodiment of the present invention, the enormous number of sequential commands can be effectively narrowed down and bugs therein can be effectively found. Thus, reduction of the verification period and reduction of the work load on the verification engineers can be facilitated.

The verification aiding method described in the embodiment can be realized by executing a program prepared in advance on a computer such as a personal computer and a work station. This program is recorded on a computer-readable recording medium such as an HD, an FD, a CD-ROM, an MO or a DVD, and is executed by being read from the recording medium by the computer.

According to the embodiments described above, reduction of the time necessary for verification and reduction of work load on verification engineers can be facilitated.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable recording medium storing therein a verification aiding program that causes a computer to execute an operation, the operation comprising:
   acquiring implementation description information of a circuit;
   classifying, for each of commands executable by the circuit, registers in the circuit that are used in execution of the commands into each type of processing by the commands, based on the implementation description information; and
   setting verification priority for each of combinations of a first command to be executed and a second command to be executed after the first command, the first command and the second command being selected from among the commands, and the verification priority set depending on the combinations.

2. The computer-readable recording medium according to claim 1, wherein
   the verification priority is set to be higher than others for one combination among the combinations, the one combination of which the first command indicates "writing" and the second command indicates "reading" as processing to be executed in an identical register.

3. The computer-readable recording medium according to claim 1, wherein
   the verification priority is set to be higher than others for one combination among the combinations, the one combination of which the first command indicates "writing" and the second command indicates "writing" as processing to be executed in an identical register.

4. The computer-readable recording medium according to claim 1, wherein
   the verification priority is set to be higher than others for a first combination among the combinations, the first combination of which the first command indicates "writing" and the second command indicates "reading" as processing to be executed in an identical register, and
   the verification priority is set to be lower than the first combination and higher than other combinations for a second combination among the combinations, the second combination of which the first command indicates "writing" and the second command indicates "writing" as processing to be executed in an identical register, the other combinations being combinations other than the first combination and the second combination among the combinations.

5. The computer-readable recording medium, according to claim 1, where in the verification aiding program further causes the computer to execute:
   comparing, for each of the commands, registers that are classified by type of processing executed by the commands according to a specification of the circuit and the registers classified at the classifying; and
   detecting a combination of which the processing is different from those according to the specification from among the combinations, based on a result of comparison at the comparing, and
   the setting includes setting the verification priority based on a result of detection at the detecting.

6. The computer-readable recording medium according to claim 1, wherein the verification aiding program further causes the computer to execute generating a sequential command executable by the circuit, by arranging the commands in time sequence based on the verification priority.

7. The computer-readable recording medium according to claim 1, wherein the verification aiding program further causes the computer to execute:
   receiving identification information of a sequential command formed by arranging a plurality of commands in time sequence; and
   calculating validity of the sequential command based on the identification information and the verification priority.

8. A verification aiding apparatus comprising:
   an acquiring unit that acquires implementation description information of a circuit;
   a classifying unit that classifies, for each of commands executable by the circuit, registers in the circuit that are used in execution of the commands into each type of processing by the commands, based on the implementation description information; and
   a setting unit that sets verification priority for each of combinations of a first command to be executed and a second command to be executed after the first command, the first command and the second command being selected from among the commands, and the verification priority set depending on the combinations.

9. The verification aiding apparatus according to claim 8, wherein
   the verification priority is set to be higher than others for one combination among the combinations, the one combination of which the first command indicates "writing" and the second command indicates "reading" as processing to be executed in an identical register.

10. The verification aiding apparatus according to claim 8, wherein
    the verification priority is set to be higher than others for one combination among the combinations, the one combination of which the first command indicates "writing" and the second command indicates "writing" as processing to be executed in an identical register.

11. The verification aiding apparatus according to claim 8, wherein
    the verification priority is set to be higher than others for a first combination among the combinations, the first combination of which the first command indicates "writing" and the second command indicates "reading" as processing to be executed in an identical register, and
    the verification priority is set to be lower than the first combination and higher than other combinations for a second combination among the combinations, the second combination of which the first command indicates "writing" and the second command indicates "writing" as processing to be executed in an identical register, the other combinations being combinations other than the first combination and the second combination among the combinations.

12. The verification aiding apparatus according to claim 8, further comprising:
    a comparing unit that compares, for each of the commands, registers that are classified by type of processing executed by the commands according to a specification of the circuit and the registers classified by the classifying unit; and
    a detecting unit that detects a combination of which the processing is different from those according to the specification from among the combinations, based on a result of comparison by the comparing unit, wherein
    the setting unit sets the verification priority based on a result of detection by the detecting unit.

13. The verification aiding apparatus according to claim 8, further comprising generating a sequential command executable by the circuit, by arranging the commands in time sequence based on the verification priority.

14. The verification aiding apparatus according to claim 8, further comprising:
   a receiving unit that receives identification information of a sequential command formed by arranging a plurality of commands in time sequence; and
   a calculating unit that calculates validity of the sequential command based on the identification information and the verification priority.

15. A verification aiding method comprising:
   acquiring implementation description information of a circuit;
   classifying, for each of commands executable by the circuit, registers in the circuit that are used in execution of the commands into each type of processing by the commands, based on the implementation description information; and
   setting, using a processor of a computer, verification priority for each of combinations of a first command to be executed and a second command to be executed sequentially after the first command, the first command and the second command being selected from among the commands, and the verification priority set depending on the combinations.

16. The verification aiding method according to claim 15, wherein
   the verification priority is set to be higher than others for one combination among the combinations, the one combination of which the first command indicates "writing" and the second command indicates "reading" as processing to be executed in an identical register.

17. The verification aiding method according to claim 15, wherein
   the verification priority is set to be higher than others for one combination among the combinations, the one combination of which the first command indicates "writing" and the second command indicates "writing" as processing to be executed in an identical register.

18. The verification aiding method according to claim 15, wherein
   the verification priority is set to be higher than others for a first combination among the combinations, the first combination of which the first command indicates "writing" and the second command indicates "reading" as processing to be executed in an identical register, and
   the verification priority is set to be lower than the first combination and higher than other combinations for a second combination among the combinations, the second combination of which the first command indicates "writing" and the second command indicates "writing" as processing to be executed in an identical register, the other combinations being combinations other than the first combination and the second combination among the combinations.

19. The verification aiding method according to claim 15, further comprising:
   comparing, for each of the commands, registers that are classified by type of processing executed by the commands according to a specification of the circuit and the registers classified at the classifying; and
   detecting a combination of which the processing is different from those according to the specification from among the combinations, based on a result of comparison at the comparing, wherein
   the setting includes setting the verification priority based on a result of detection at the detecting.

20. The verification aiding method according to claim 15, further comprising generating a sequential command executable by the circuit, by arranging the commands in time sequence based on the verification priority.

21. The verification aiding method according to claim 15, further comprising:
   receiving identification information of a sequential command formed by arranging a plurality of commands in time sequence; and
   calculating validity of the sequential command based on the identification information and the verification priority.

* * * * *